United States Patent [19]
Fritz et al.

[11] Patent Number: 5,717,477
[45] Date of Patent: Feb. 10, 1998

[54] SUPPORT BEARING ELECTRIC CONDUCTORS HAVING AN ELECTRONIC COMPONENT WITH CONTACT WARTS COATED WITH GRAPHITE CONTACTING THE CONDUCTORS AND METHOD OF CONTACTING

[75] Inventors: Bernd Fritz, Wörth; Timm Salzmann, Schaafheim, both of Germany

[73] Assignee: Optrex Europe GmbH, Eschborn, Germany

[21] Appl. No.: 681,175

[22] Filed: Jul. 22, 1996

[30] Foreign Application Priority Data

Jul. 28, 1995 [DE] Germany ............... 195 27 661.2

[51] Int. Cl.[6] ............ G02F 1/1345; H01R 43/00; B23K 31/02; H05K 7/02
[52] U.S. Cl. ............ 349/151; 29/885; 228/180.22; 349/149; 361/760; 437/212
[58] Field of Search ............ 349/151, 149; 29/874, 885; 361/760, 762; 228/180.22; 437/211, 212

[56] References Cited

U.S. PATENT DOCUMENTS 5,130,832  7/1992  Kawaguchi et al. ............ 349/151
5,578,527  11/1996  Charg et al. ............ 437/211

FOREIGN PATENT DOCUMENTS 55-35326  3/1980  Japan ............ 349/149

Primary Examiner—Anita Pellman Gross
Attorney, Agent, or Firm—Martin A. Farber

[57] ABSTRACT

For the contacting of conductors of a support with contact warts of an electronic component, the contact warts are first of all coated on the side thereof facing the support with a graphite material which remains resilient in hardened condition. Adhesive is then applied to the electronic component between the contact warts or in corresponding manner on a support. The electronic component is then pressed with initial stress against the support until the adhesive has hardened.

5 Claims, 1 Drawing Sheet

SUPPORT BEARING ELECTRIC CONDUCTORS HAVING AN ELECTRONIC COMPONENT WITH CONTACT WARTS COATED WITH GRAPHITE CONTACTING THE CONDUCTORS AND METHOD OF CONTACTING

FIELD AND BACKGROUND OF THE INVENTION

The present invention relates to a support bearing electric conductors and having an electronic component which contacts the conductors by contact warts and is held by an adhesive on the support. The invention also concerns a method for contacting conductors of a substrate with contact warts of an electronic component.

Supports of the above type bearing at least one electronic component are very frequent in electronics. For the contacting of integrated circuits (IC) and liquid-crystal displays (LCD) so-called FLIP-CHIP technology is used today. In it, an integrated circuit sawn from a wafer is provided with bumps as contact warts and applied directly onto a glass edge surface of a liquid-crystal display. For this purpose, the side of the contact warts facing the liquid-crystal cell is wetted with an isotropic epoxy contact adhesive and the integrated circuits then pressed onto the support. The structural unit consisting of support and integrated circuits is then introduced into an oven for hardening. The gap between the electronic component in question and the support must then be filled with a filler material so that sufficient mechanical strength is obtained and electric migrations are avoided.

Such a contacting is substantially more cost-favorable than tab soldering, which is most widely used, in particular, for the contacting of integrated circuits with liquid-crystal displays, in which the contacting is effected by a soldering process; however, it is still relatively expensive and requires unusually long cycle times upon manufacture for the individual operations. Contactings which are more favorable in cost have not been found up to now for applications in which large temperature differences are to be expected, for instance for motor vehicles, since the different expansions which occur due to temperature differences exert a high stress on the contacting.

SUMMARY OF THE INVENTION

The present invention is based on the problem of developing a support bearing an electronic component in which the contacting can be produced at particularly favorable cost and remains reliable even in the case of large temperature variations. Furthermore, a method is to be developed for contacting such a component with the support.

The first object is achieved, in accordance with the invention, in the manner that on their sides facing the support, the contact warts bear a coating of a graphite material which remains resilient when hardened, that the adhesive fills the gap between the electronic component and the support, and that the electronic component is held by the adhesive with its contact warts under initial stress on the conductors of the support.

With such an arrangement of an electronic component on a support, the contacting of the conductors of the support is effected by a pre-stressing force of the electronic component. The resiliency necessary for this is obtained by the graphite material. Since the electronic component as a whole is held on the support and not merely by the contact warts, the pre-stressing, of course, is still retained after a long time and does not lead to a loosening of the electronic component from the support. If the layer of adhesive expands by heating, and therefore becomes thicker, the distance between the electronic component and the support increases, it is true, but the graphite material is able to compensate for this change in distance as a result of the initial stressing. The bonding has the fundamental advantage over soldering that the electronic component is not acted on by higher temperatures upon the contacting. Furthermore, the underfill material previously required is saved.

It is particularly advantageous if, in accordance with a further development of the invention, the support is transparent and the adhesive is an adhesive which is hardened by ultraviolet light. The support can then simply be transilluminated by the source of light and the adhesive thereby hardened. By the polymerization of the adhesive which takes place under the action of ultraviolet light, the adhesive shrinks, which additionally increases the prestressing force.

The use of the invention is particularly advantageous when the support is the surface of the glass edge of the liquid-crystal display of a liquid-crystal cell and electronic component is an integrated circuit sawn from a wafer (DIE).

The second object, namely the creating of a method for contacting conductors of a support with contact warts of an electronic component is achieved, in accordance with the invention, in the manner that, first of all, the contact warts are coated on their side facing the support with a graphite material which remains resilient in hardened state, that adhesive is then applied to the electronic component between the contact warts or in corresponding manner on the support, and the electronic component is then pressed under initial stress on the support until the adhesive has hardened.

Such a method is particularly inexpensive to carry out and, due to the forces of initial stress between the electronic component and the support, permits a particularly reliable contacting which is not affected by changes in temperature. The bonding has a two-fold function in accordance with the invention. It holds the electronic component on the support and at the same time prevents moisture and impurities from entering into the gap between the electronic component and the support, and therefore has the function of an underfill. The application of the adhesive does not afford any difficulty. It need not be very accurately measured with regard to its position or amount. Even if adhesive should come onto the contact warts or conductors, this is unimportant since it would be squeezed out again in the contacting regions upon the pressing of the electronic component.

The method is particularly advantageous if, in accordance with a further development of the invention, a transparent material is used as support and an adhesive which hardens under UV light is used as adhesive, the UV light being directed onto the adhesive through the support.

BRIEF DESCRIPTION OF THE DRAWINGS

With the above and other objects and other advantages in view, the present invention will become more clearly understood in connection with the detailed description of preferred embodiment, when considered with the accompanying drawings of which.

DETAILED DESCRIPTION OF THE PREFERRED EMBODIMENT

Figure 1:
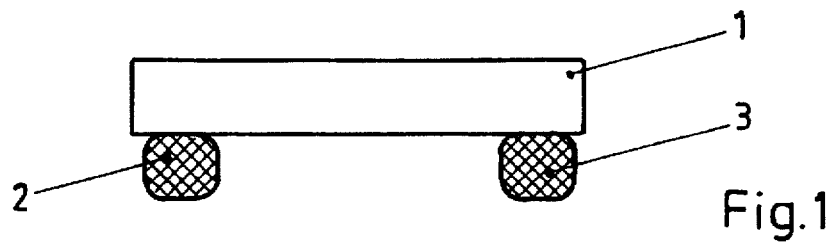
FIG. 1 shows an electronic component developed as DIE which is to be connected to a support.

FIG. 1 shows an electronic component 1 which has contact warts 2, 3 on its bottom, they preferably consisting of gold and being referred to in general as bumps. This structural part consists of an integrated circuit sawn from a wafer (DIE) which is then applied directly onto a medium to be contacted—a glass edge surface of a liquid-crystal display.

Figure 2:
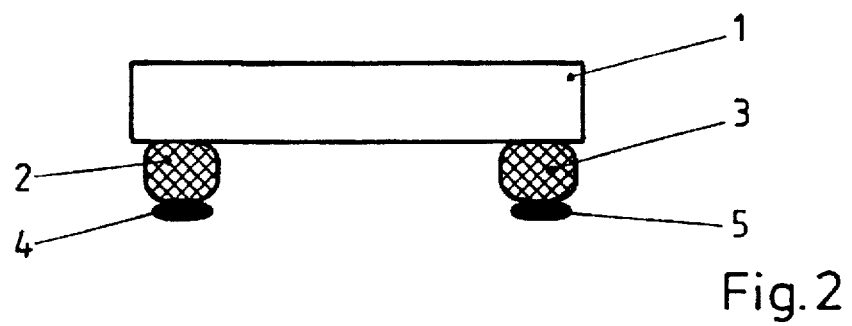
FIG. 2 shows the component with a coating on its contact warts.

In FIG. 2, the electronic component 1 is shown with a coating 4, 5 of a resilient graphite material present on the bottom of the contact warts 2, 3.

Figure 3:
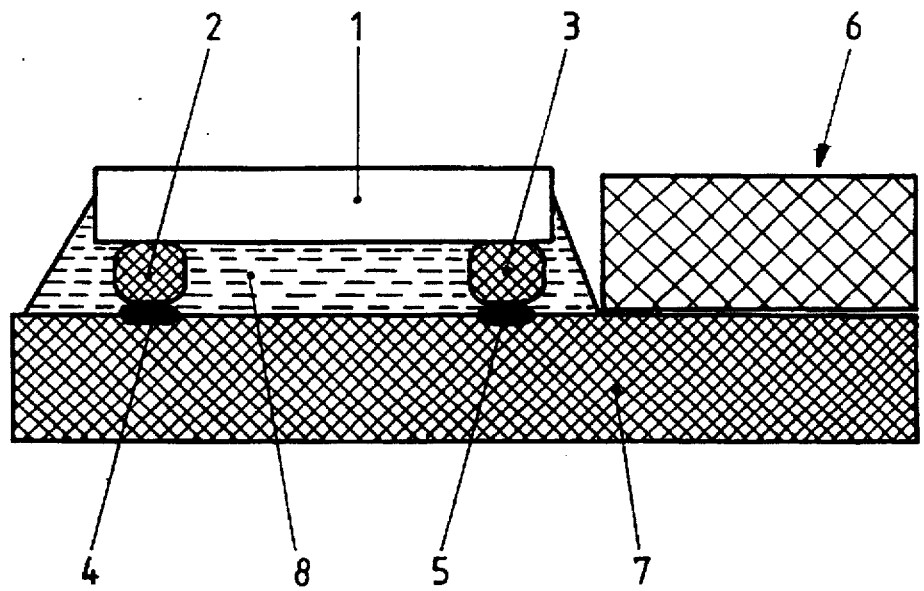
FIG. 3 shows a part of a support forming a liquid-crystal cell with the electronic component.

FIG. 3 shows a liquid-crystal cell 6 with a transparent support 7. The support has conductors (not visible) which are formed also as transparent ITO coating. The electronic component 1 is seated with its contact warts 4, 5 under initial stress on the conductors of this support and is held in this position by an adhesive 8 which fills the entire region between the support 7 and the bottom of the electronic component 1. The adhesive 8 is an adhesive which is hardened by UV light and which, before the connecting of the electronic component 1 to the support 7, is applied either as drops between the contact warts 2, 3 or onto the support 7, so that it spreads out upon the pressing-on of the electronic component 1.

We claim:

1. A support having electric conductors and bearing an electronic component, the support comprising:

contact warts providing contact between the electronic component and the conductors;

an adhesive for holding the electronic component on the support;

a coating of a graphite material disposed on a side of each of said contact warts facing said support, the coating of the graphite material remaining resilient in hardened state;

wherein said adhesive fills a gap between the electronic component and the support; and the electronic component is held by said adhesive with said contact warts under initial stress on said conductors of the support.

2. A support according to claim 1, wherein the support is transparent and said adhesive is an adhesive which is hardened by UV light.

3. A support according to claim 2, wherein the support is a glass-edge surface of a liquid-crystal display, and the electronic component is an integrated circuit sawn directly from a wafer (DIE).

4. A method of contacting conductors of a support with contact warts of an electronic component, comprising steps of:

coating each of the contact warts on a side of each wart facing the support with a graphite material which remains resilient in hardened state;

applying adhesive to one of said electronic component or said support between said contact warts;

pressing said electronic component with initial stress on the support; and hardening said adhesive during said pressing step.

5. A method according to claim 4, wherein said support comprises a transparent material, and said adhesive hardens upon exposure to ultraviolet light; and said hardening step is accomplished by directing the ultraviolet light through the support upon the adhesive.

\* \* \* \* \*